United States Patent [19]

Polinsky

[11] 3,876,472

[45] Apr. 8, 1975

[54] METHOD OF ACHIEVING SEMICONDUCTOR SUBSTRATES HAVING SIMILAR SURFACE RESISTIVITY

[75] Inventor: Murray Arthur Polinsky, Somerville, N.J.

[73] Assignee: RCA Corporation, New York, N.Y.

[22] Filed: Apr. 15, 1974

[21] Appl. No.: 461,111

[52] U.S. Cl. ................. 148/1.5; 148/188; 148/191; 357/89; 357/91

[51] Int. Cl. ............................................. H01l 7/54

[58] Field of Search ....... 148/1.5, 188, 191; 357/89, 357/91

[56] References Cited

UNITED STATES PATENTS

| | | | |
|---|---|---|---|
| 3,653,978 | 4/1972 | Robinson et al. | 148/1.5 |
| 3,666,567 | 5/1972 | Hunsperger et al. | 148/1.5 |
| 3,793,088 | 2/1974 | Ecton, Jr. | 148/1.5 |

*Primary Examiner*—L. Dewayne Rutledge
*Assistant Examiner*—J. M. Davis
*Attorney, Agent, or Firm*—H. Christoffersen; R. P. Williams; T. H. Magee

[57] ABSTRACT

A method of achieving semiconductor substrates having similar surface resistivity comprises implanting ions into semiconductor substrates of very high resistivity and then, preferably, subjecting the substrates to a drive-in diffusion. This method can be utilized in the manufacture of CMOS integrated circuits to achieve transistors having closely matched threshold voltages.

15 Claims, 2 Drawing Figures

METHOD OF ACHIEVING SEMICONDUCTOR SUBSTRATES HAVING SIMILAR SURFACE RESISTIVITY

Figure 1:
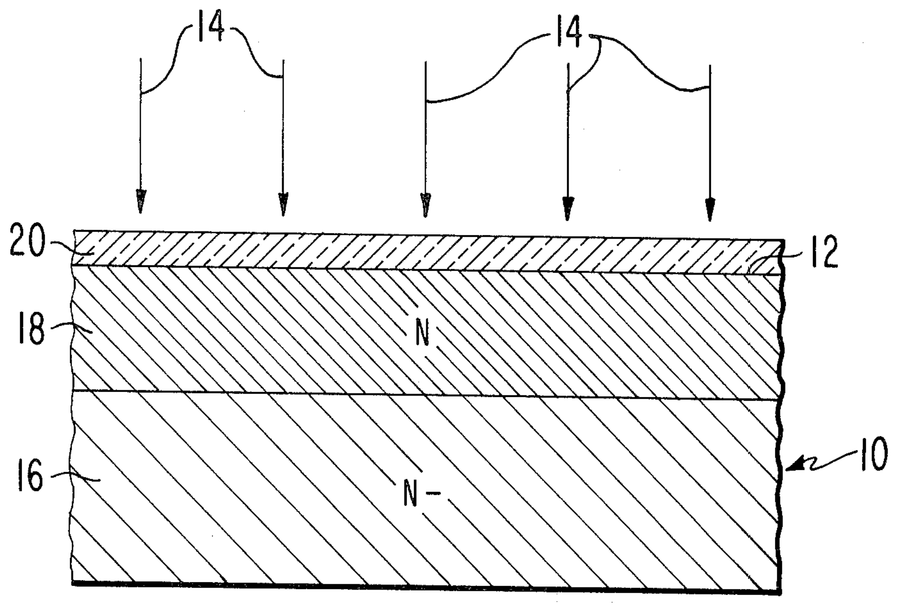

This invention relates to a method of precisely doping semiconductor substrates of relatively high resistivity in order to produce substrates of substantially uniform resistivity which can be used in the manufacture of CMOS (complementary metal oxide semiconductor) integrated circuit devices to achieve channels having closely matched threshold voltages.

The threshold, or turn-on, voltage of an enhancement mode MOS (metal oxide semiconductor) transistor is a value of gate voltage for which current just starts to flow in the region between the drain and source. The current path between the drain and source is known as the channel, and an MOS transistor is often labelled as either a P channel or N channel transistor depending respectively on whether the type conductivity of the source and drain, and the channel in the "on" state, is P type or N type. The threshold voltage is dependent upon, among other things, the concentration of the conductivity modifiers in the channel region, which is in turn inversely proportional to the resistivity of the channel region. In order to control, and thus be able to match, the magnitudes of the threshold voltages in an integrated circuit device which includes both types of transistors, i.e., a CMOS device, it is necessary to control the resistivity of the channel regions in the P channel and N channel MOS transistors.

In manufacturing CMOS integrated circuit devices, there are resistivity variations inherent in the starting substrates significant enough to alter the threshold voltages of the transistors and thus reduce the yield in the production of CMOS circuits having matched threshold voltages. Starting with N type substrates, these resistivity variations will not significantly affect the N channel transistors since these transistors lie in doped P well regions whose resistivity is controlled during the formation thereof by controlling the concentration of P type dopant. The concentration of P type dopant in this P well region is of such greater magnitude than the concentration of N type dopant in the starting substrate that it renders negligible the effect of the inherent resistivity variations in the substrate on threshold voltage. Ion implantation has been used to control the threshold voltages of the N channel transistors by precisely controlling the amount of P type dopant implanted in the N type substrates when forming the P well regions. The threshold voltages of the P channel transistors which are not contained within doped well regions are subject, however, to the resistivity variations of the starting substrates.

Figure 2:
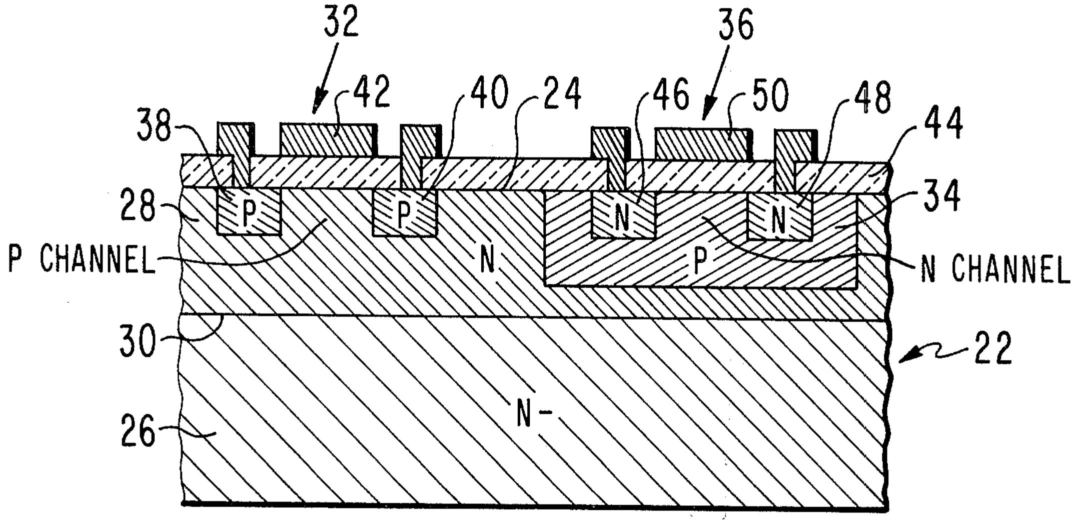

IN THE DRAWINGS:

FIG. 1 is a partial cross-sectional view of a portion of a silicon wafer illustrating the method of the present invention; and FIG. 2 is a cross-sectional view of a CMOS device manufactured from a silicon wafer which has been processed in accordance with the method of the present invention.

FIG. 1 illustrates a semiconductor substrate and diagramatically shows the ion implantation method of the present invention. The starting substrate is usually a silicon wafer 10 of one type of extrinsic conductivity, N-type as shown in FIG. 1, whose resistivity is very high, preferably between 25 and 50 ohm-centimeters. It is preferred that the starting wafer 10 be an extrinsic semiconductor of a specific type conductivity in order to have an end product whose substrate is of a certain and known type conductivity. Although a practical range for the resistivity of the starting wafer 10 is between 25 and 50 ohm-centimeters, it is best that the resistivity be as high as feasible in order to have the concentration of the subsequently implanted ions of such greater magnitude than the impurity concentration in the starting wafer 10 that it renders negligible the inherent resistivity variations in the starting wafer 10.

A major surface 12 of the silicon wafer 10 is then bombarded with a beam of ions, illustrated by arrows 14 in FIG. 1, generated within a conventional ion implantation system which is not shown. The ions are of a conductivity modifier having the same type conductivity as that of the wafer 10, which should be ions of a suitable donor such as phosphorus for a wafer 10 of N- type conductivity. The implantation is preferably coextensive with the surface 12 of the substrate 10 although this method can also be practiced by implanting only selected areas of the surface 12. The wafer 10 now comprises a region 16 of the original N- type concentration and a more heavily doped N region 18 directly beneath the surface 12 of the wafer 10 where the ions are implanted.

In a preferred embodiment of the present invention, the wafer is then subjected to a drive-in diffusion of the implanted ions by heating the wafer 10 to a temperature at which the ions will diffuse to a greater depth within the wafer in order to achieve a more uniform distribution of the conductivity modifiers and to set a desired surface resistivity. A typical drive in diffusion is accomplished by heating the wafer in a furnace to a temperature of about 1,200°C for about 15 hours. This heating step simultaneously serves as an annealing step which removes damage to the wafer 10 caused by the ion bombardment.

An oxide layer 20 such as silicon dioxide may be grown at low temperature over the implanted area prior to the drive-in diffusion. Also, the heating step used to drive in the ions may be carried out in a non-oxidizing atmosphere. When ions of a suitable acceptor, such as boron, are implanted in a substrate of P-type conductivity, not shown in the present embodiment, the use of a capping oxide layer 20 and a non-oxidizing atmosphere during the heating step reduces the loss, by segregation or out diffusion, of the P type impurities into a growing oxide or into the ambient atmosphere, and also reduces possible non-uniformity of impurities due to non-uniform out diffusion.

Since ion implantation can be accurately controlled, as is known, to introduce a precise number of dopant ions into the surface of the wafer 10 by controlling the ion beam current, this method can be used to precisely dope, either individually or simultaneously in a batch, a plurality of high resistivity wafers which can then be used in any manufacturing operation where wafers of a uniform and substantially equal surface resistivity from wafer to wafer are desired. This novel method is practiced preferably by doping different batches of wafers whereby batches of wafers having substantially equal surface resistivity from batch to batch are achieved. This method is particularly applicable in manufacturing CMOS integrated circuits to achieve channels having matched threshold voltages both within an individual wafer and also from one wafer or batch of wafers to the next.

FIG. 2 illustrates a CMOS device manufactured from a high resistivity silicon wafer 22 of N- type conductivity which has been processed by this method. In accordance with this method, a major surface 24 of the silicon wafer 22 is bombarded with a beam of ions of a suitable donor such as phosphorus. In a preferred embodiment of this method, it is then subjected to a drive-in diffusion of the implanted ions. The wafer 22 now comprises a region 26 of the original N- type concentration and a more heavily doped N region 28 directly beneath the surface 24 of the wafer 22 where the ions were implanted, the two regions 26 and 28 being separated by the lower boundary 30 of region 28.

Formed in the silicon wafer 22 by known conventional techniques is a P channel MOS transistor 32 and P well region 34 in which an N channel MOS transistor 36 is disposed. The P channel transistor 32 has spaced source and drain regions 38 and 40, respectively, formed adjacent to the surface 24 of the wafer 22 and defining the ends of a charge carrier (P type) channel. A gate electrode 42 overlies the space between the source and drain regions 38 and 40 and is separated therefrom by an insulator. The insulator may be part of an insulating layer 44 disposed on the surface 24 of the wafer 22. The N channel transistor 36 has spaced source and drain regions 46 and 48, respectively, formed in the P well region 34 adjacent to the surface 24 of the wafer 22 and defining the ends of a charge carrier (N type) channel which lies in the doped P well region 34. A gate electrode 50 overlies the space between the source and drain regions 46 and 48 and is separated therefrom by an insulator which may be part of the insulating layer 44.

The P well region 34 is formed by selectively implanting ions of a P type impurity, while the source and drain regions of the P and N channel transistors 32 and 36 may be formed, for example, by selectively diffusing dopant impurities through an opening in an oxide mask in a diffusion furnace. Preferably, the source and drain regions of the P and N channel transistors 32 and 36 are formed subsequent to the N type ion implantation step. However, the steps may be reversed by doing this ion implantation step after forming the source and drain regions and prior to forming the gate electrodes 42 and 50. The insulating layer 44 may be formed by thermally oxidizing a portion of the N region 28. A layer 44 of silicon dioxide may be formed on the surface 24 by heating the wafer 22 in an oxidizing atmosphere containing HCl, such as that formed by boiling a dilute solution of HCl and water, to a temperature of about 875°C for a period of about 1 hour. Although a thermal oxidation step of this kind consumes part of the material of the N region 28 so that a new boundary is produced within the wafer 22, for convenience in illustration, the surface of the region 28 over which the layer 44 of oxide has been thermally grown will be designated as the surface 24 of the wafer 22.

In a preferred embodiment this oxide layer 44 is then subjected to an annealing step by heating the wafer 22 to a temperature of about 1,000°C for a period of about 10 minutes in an inert or hydrogen containing atmosphere in order to reduce surface-state charge located at the surface of the channel regions of the transistors 32 and 36 and to reduce negative bias-temperature stress instability. See, for example, Hofstein, "Stabilization of MOS Devices," *Solid State Electronics*, 1967 Vol. 10, page 657–670, at page 662. The gate electrodes 42 and 50 and ohmic contacts to the source and drain regions are formed by known conventional metallization processes.

Although FIG. 2 shows the source and drain regions of the P and N channel transistors 32 and 36 as lying completely within the N region 28, this is not necessary in order to match the magnitudes of the threshold voltages of the transistors 32 and 36, and the boundary 30 of region 28 may in fact lie closer to the surface 24 of the wafer 22 with the P well region 34 alone or together with the source and drain regions of transistor 32 extending below this boundary 30. In using this novel method to manufacture P channel MOS transistors, by having the depth or thickness of the N region substantially equal to or less than the depth or thickness of the drain regions, the drain-to-substrate capacitance of the transistors is reduced which improves the frequency response of the transistors.

The channel of the P channel transistor 32 will not be critically affected by the resistivity variations of the starting wafers because its channel lies in the ion implanted N region 28 the resistivity of which has been precisely determined by accurately controlling the concentration of N type ions therein. By starting with a wafer 22 of very high resistivity, the concentration of the dopant in this N region 28 is of such greater magnitude than the N– type dopant concentration of the starting wafer 22 that it renders negligible the effect of the inherent resistivity variations in the starting wafer 22 on the threshold voltage of the P channel transistor 32. Therefore, since the novel method allows control of wafer resistivity from batch to batch, the yield of CMOS integrated circuits having closely matched threshold voltages from batch to batch will be increased by starting with wafers processed in accordance with this method.

What is claimed is:

1. A method of achieving a plurality of semiconductor substrates having similar surface resistivity comprising:

bombarding surfaces of semiconductor substrates of one type conductivity and of high resistivity with ions of a conductivity modifier of said one type conductivity whereby said ions are implanted beneath said surfaces.

2. A method as recited in claim 1 wherein said bombarding step is performed by bombarding said surfaces simultaneously.

3. A method as recited in claim 1 further comprising the step of heating said substrates to a temperature at which said implanted ions will diffuse into said substrates and maintaining said substrates at said temperature until a desired surface resistivity and diffused depth of said ions is achieved.

4. A method as recited in claim 3 further comprising the step of growing a layer of oxide of the material of said substrates onto said substrates prior to said heating step.

5. A method as recited in claim 1 wherein said substrates are silicon wafers of said one type conductivity having a resistivity between 25 and 50 ohm-centimeters.

6. A method as recited in claim 5 wherein said one type conductivity is N type.

7. A method as recited in claim 6 wherein said substrates are heated at about 1,200°C for about 15 hours.

8. A method of controlling the threshold voltage of a channel lying in a region of one type conductivity in a MOS transistor which includes a semiconductor substrate of one type conductivity having spaced source and drain regions of opposite type conductivity therein, said method comprising bombarding a surface of a semiconductor substrate of high resistivity with ions of a conductivity modifier of said one type conductivity whereby said ions are implanted beneath said surface.

9. A method as recited in claim 8 further comprising the step of heating said substrate to a temperature at which said implanted ions will diffuse into said substrate and maintaining said substrate at said temperature until a desired surface conductivity and diffused depth of said ions is achieved.

10. A method as recited in claim 8 wherein said MOS transistor is disposed in a CMOS integrated circuit device and said controlling comprises matching the absolute values of the threshold voltages of the transistors in said CMOS device.

11. A method as recited in claim 10 wherein said substrate is a silicon wafer of said one type conductivity having a resistivity between 25 and 50 ohm-centimeters.

12. A method of making a CMOS integrated circuit device comprising the steps of:

bombarding a surface of a semiconductor substrate of one type conductivity and of high resistivity with ions of a conductivity modifier of said one type conductivity, forming a well region of an opposite type conductivity in said substrate adjacent to said surface, forming spaced source and drain regions of said one type conductivity in said well region adjacent to said surface, and spaced source and drain regions of said opposite type conductivity in said substrate adjacent to said surface, said source and drain regions defining the ends of channel regions adjacent to said surface, forming a layer of insulating material at least on portions of said surface overlying said channel regions, forming gate electrodes on portions of the surface of said layer overlying said channel regions, and forming ohmic contacts to said source and drain regions.

13. A method as recited in claim 12 further comprising the step of heating said substrate to a temperature at which said implanted ions will diffuse into said substrate and maintaining said substrate at said temperature until a desired surface conductivity and diffused depth of said ions is achieved.

14. A method as recited in claim 12 wherein said substrate is a silicon wafer of said one type conductivity having a resistivity between 25 and 50 ohm-centimeters.

15. A method as recited in claim 14 wherein said one type conductivity is N type.

* * * * *